United States Patent
Kao et al.

(10) Patent No.: US 11,600,528 B2
(45) Date of Patent: Mar. 7, 2023

(54) SEMICONDUCTOR STRUCTURE AND METHOD FOR FORMING THE SAME

(71) Applicant: Taiwan Semiconductor Manufacturing Co., Ltd., Hsinchu (TW)

(72) Inventors: Pei-Ling Kao, Tainan (TW); You-Ting Lin, Miaoli County (TW); Jiun-Ming Kuo, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 188 days.

(21) Appl. No.: 16/885,871

(22) Filed: May 28, 2020

(65) Prior Publication Data

US 2021/0375686 A1 Dec. 2, 2021

(51) Int. Cl.
*H01L 21/8234* (2006.01)
*H01L 21/8238* (2006.01)
*H01L 27/092* (2006.01)

(52) U.S. Cl.
CPC ........ *H01L 21/823431* (2013.01); *H01L 21/82385* (2013.01); *H01L 21/823456* (2013.01); *H01L 21/823814* (2013.01); *H01L 21/823821* (2013.01); *H01L 27/0924* (2013.01)

(58) Field of Classification Search
None
See application file for complete search history.

(56) References Cited

U.S. PATENT DOCUMENTS

| | | | |
|---|---|---|---|
| 9,209,247 B2 | 12/2015 | Colinge | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2017/0154958 A1* | 6/2017 | Fung | H01L 29/42392 |
| 2018/0366375 A1* | 12/2018 | Chen | H01L 27/0886 |
| 2019/0131431 A1* | 5/2019 | Cheng | H01L 21/823821 |

* cited by examiner

*Primary Examiner* — Joseph C. Nicely
*Assistant Examiner* — Lamont B Koo
(74) *Attorney, Agent, or Firm* — Birch, Stewart, Kolasch & Birch, LLP

(57) ABSTRACT

A method for forming a semiconductor structure is provided. The method includes forming a stack over a substrate. The stack includes alternating first semiconductor layers and second semiconductor layers. The method also includes forming a polishing stop layer over the stack and a dummy layer over the polishing stop layer, recessing the dummy layer, the polishing stop layer and the stack to form a recess, forming a third semiconductor layer to fill the recess, and planarizing the dummy layer and the third semiconductor layer until the polishing stop layer is exposed. The method also includes patterning the polishing stop layer and the stack into a first fin structure and the third semiconductor layer into a second fin structure, removing the second semiconductor layers of the first fin structure to form nanostructures, and forming a gate stack across the first fin structure and the second fin structure.

20 Claims, 11 Drawing Sheets

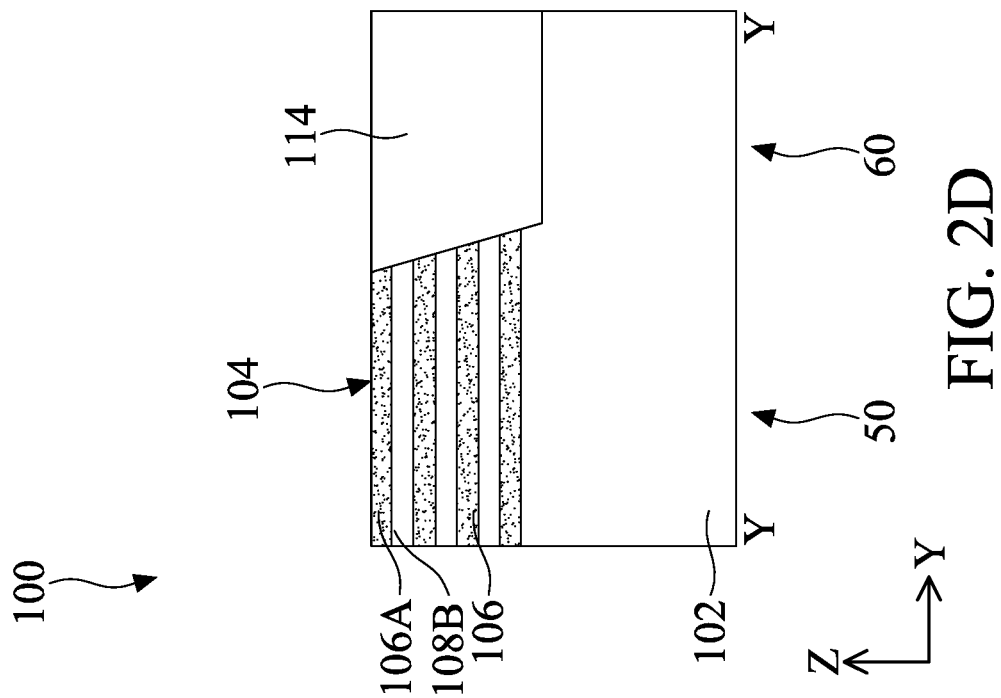
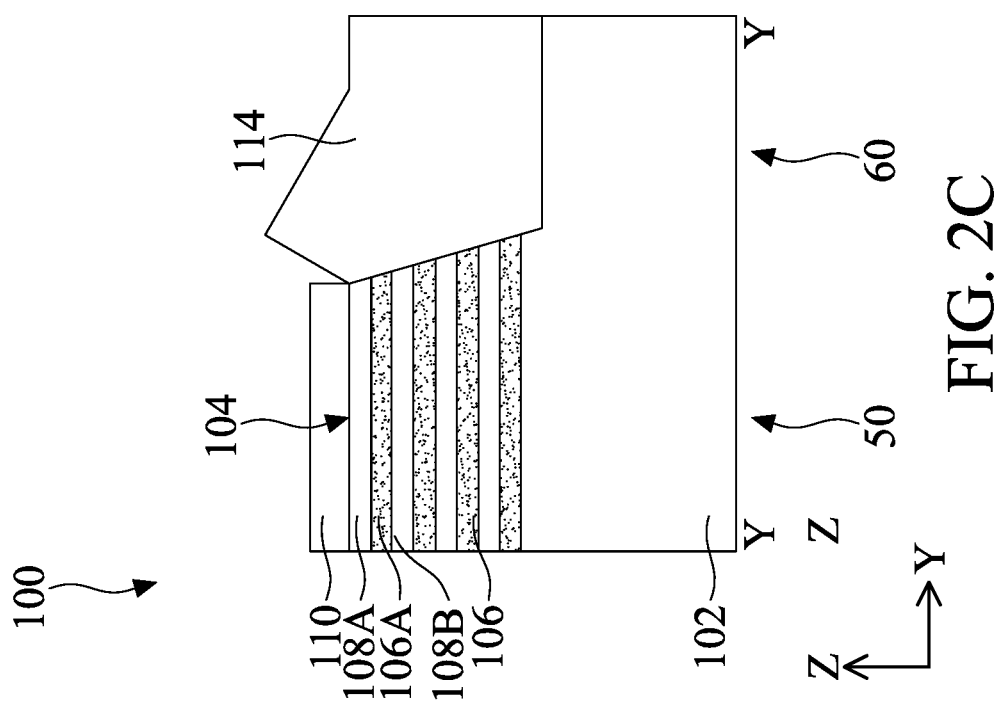

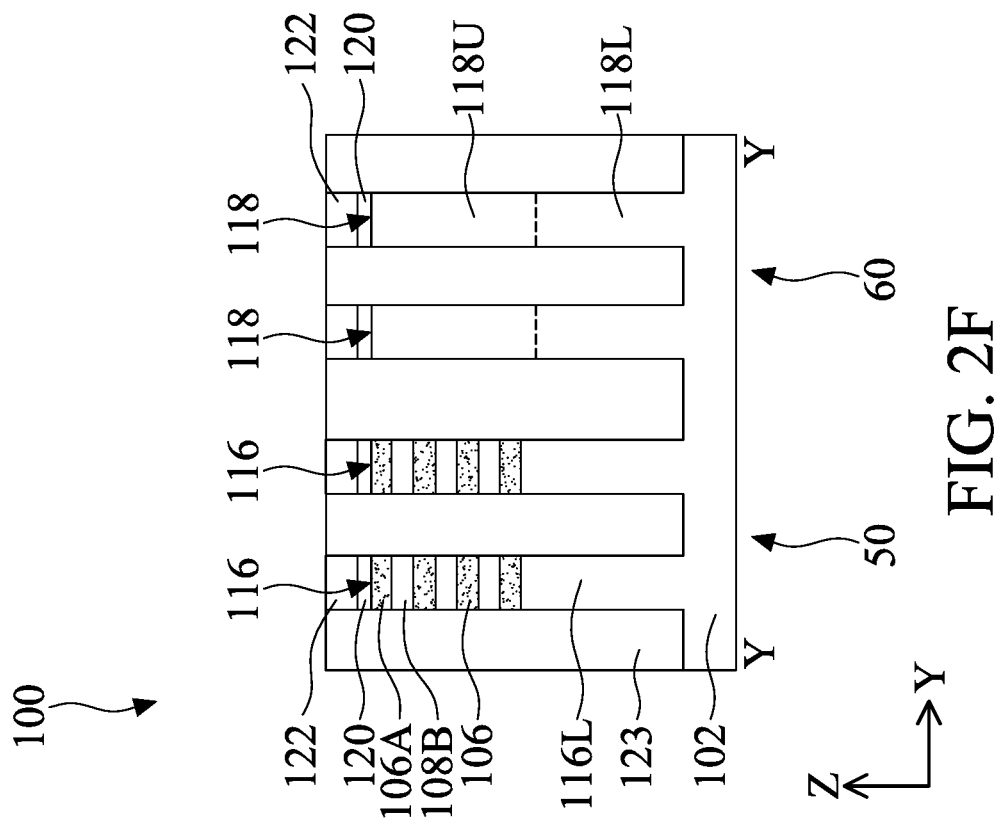
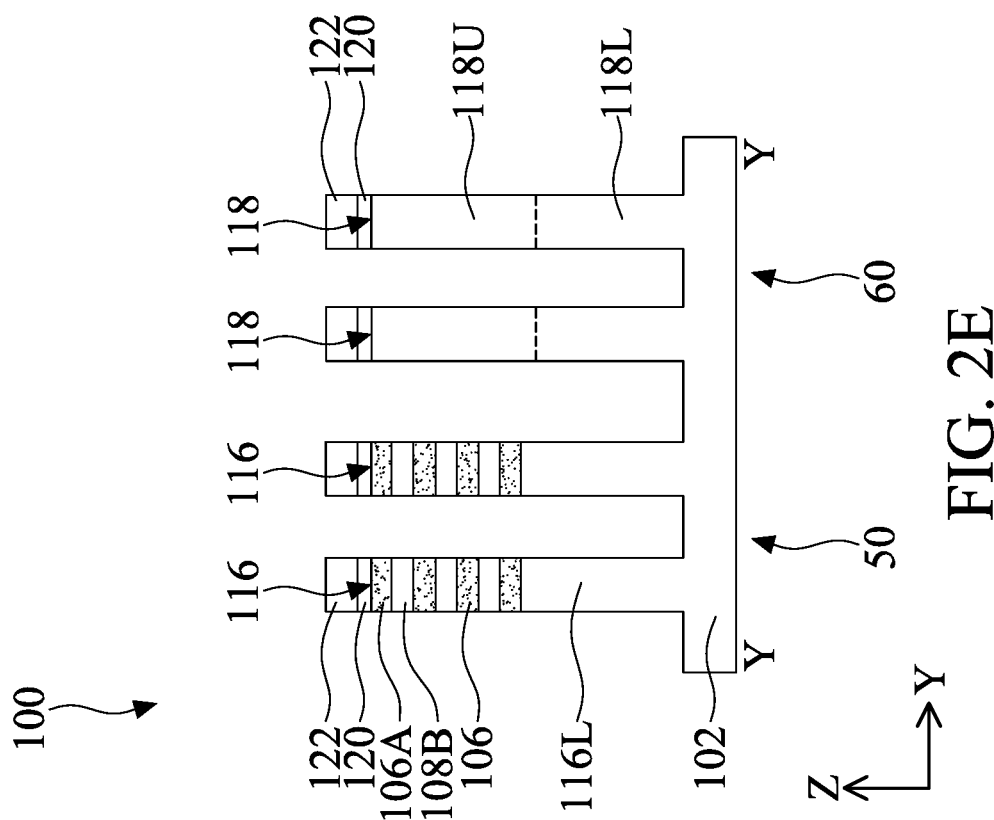

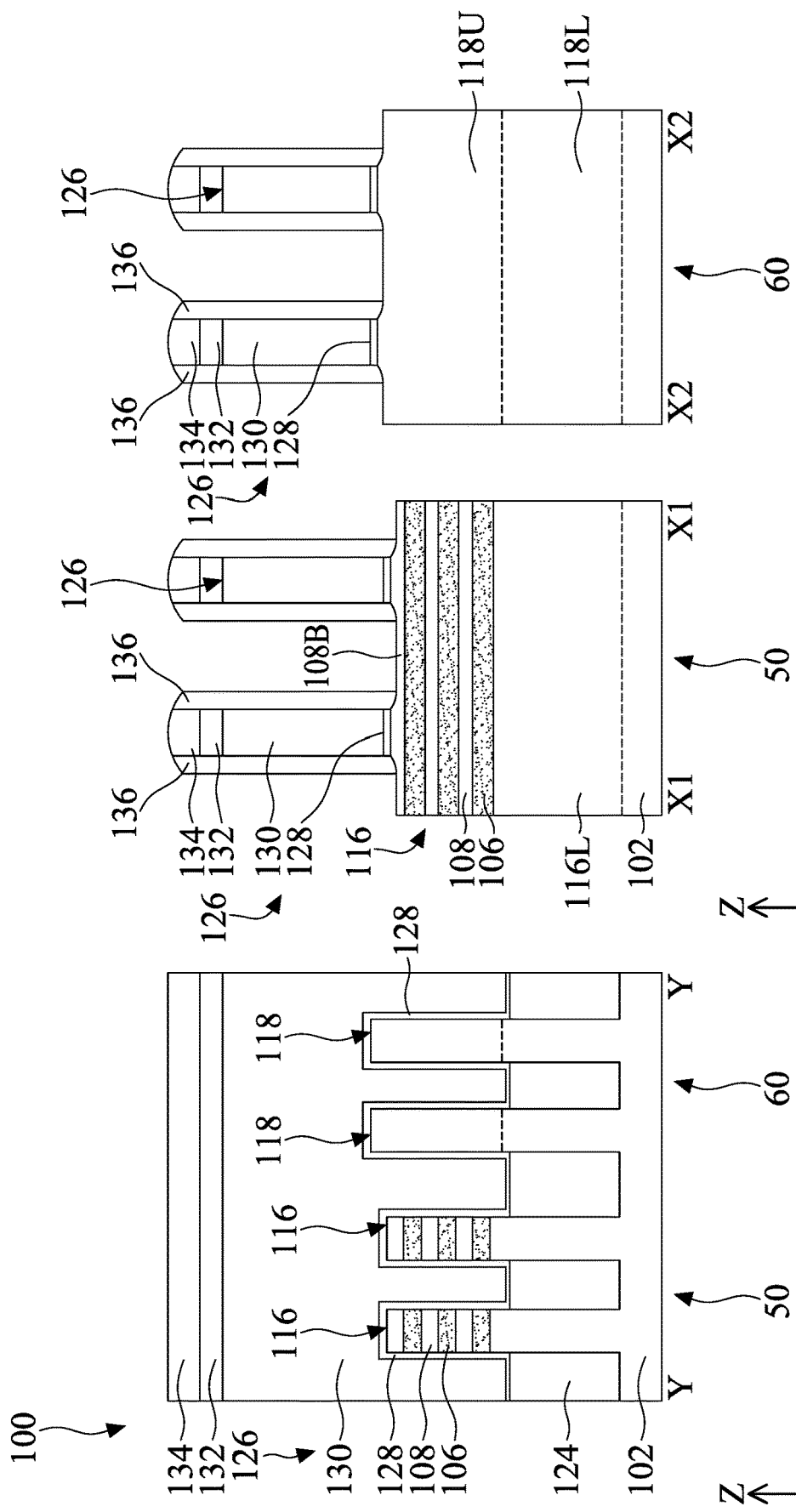

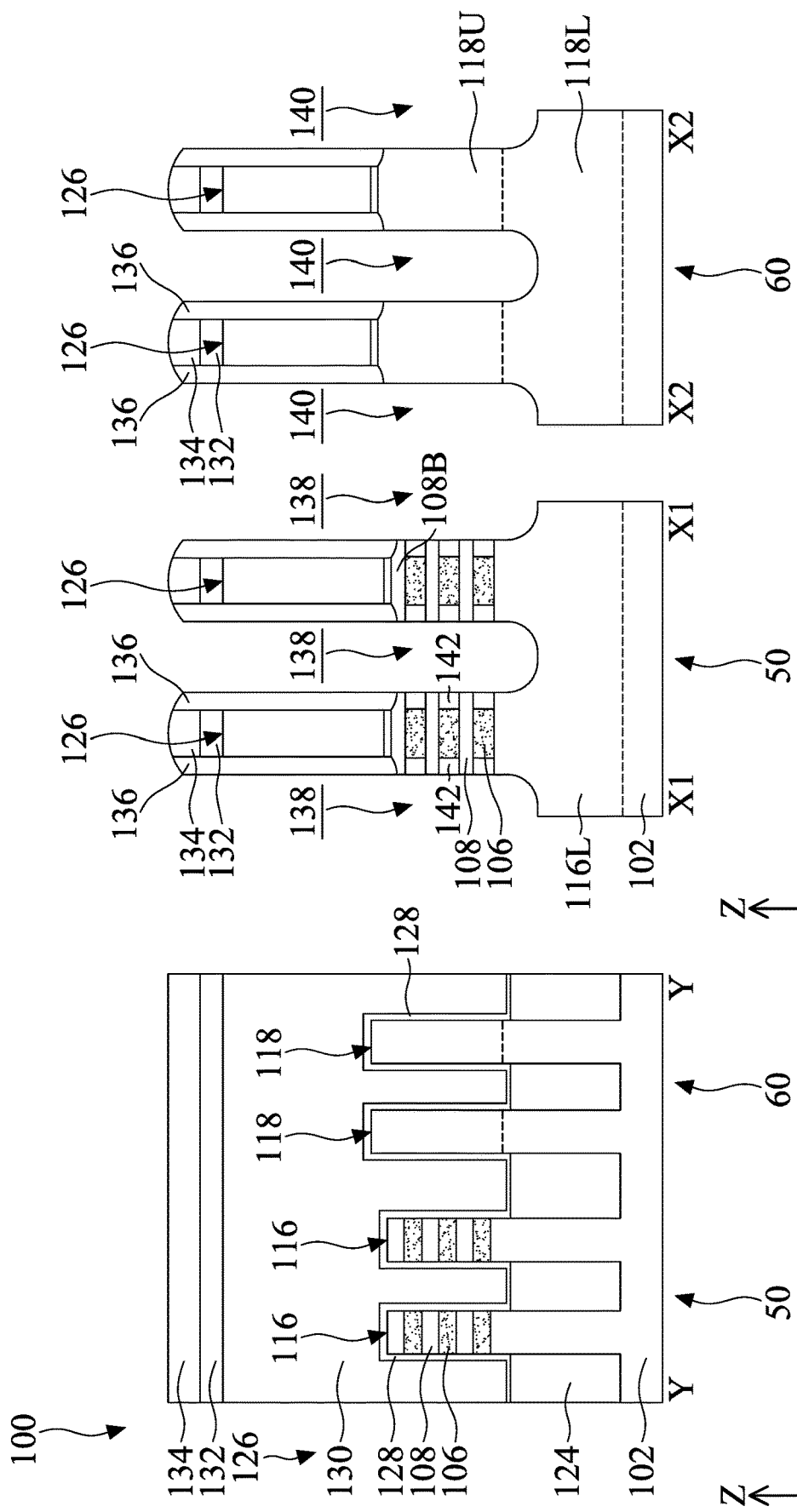

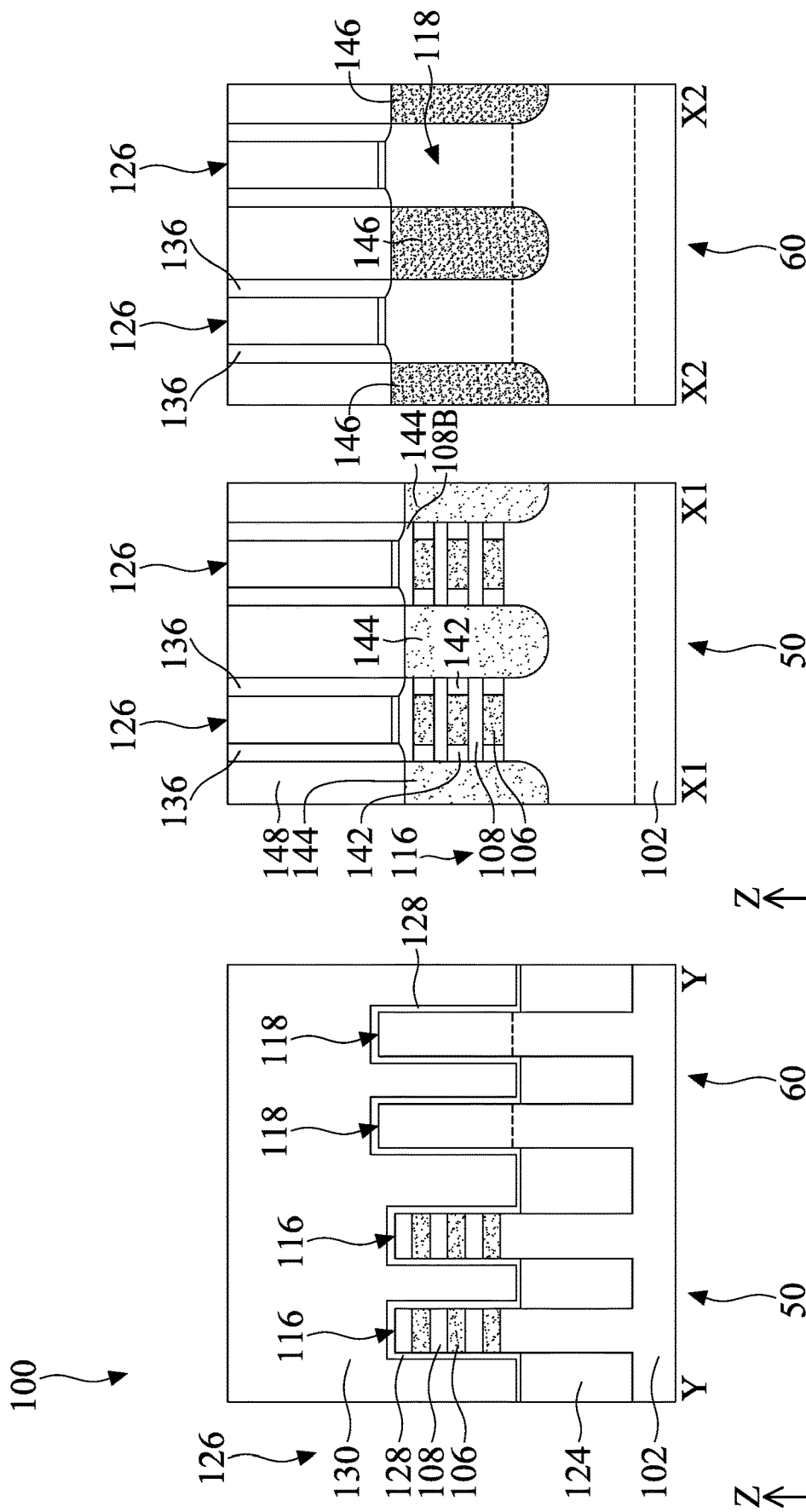

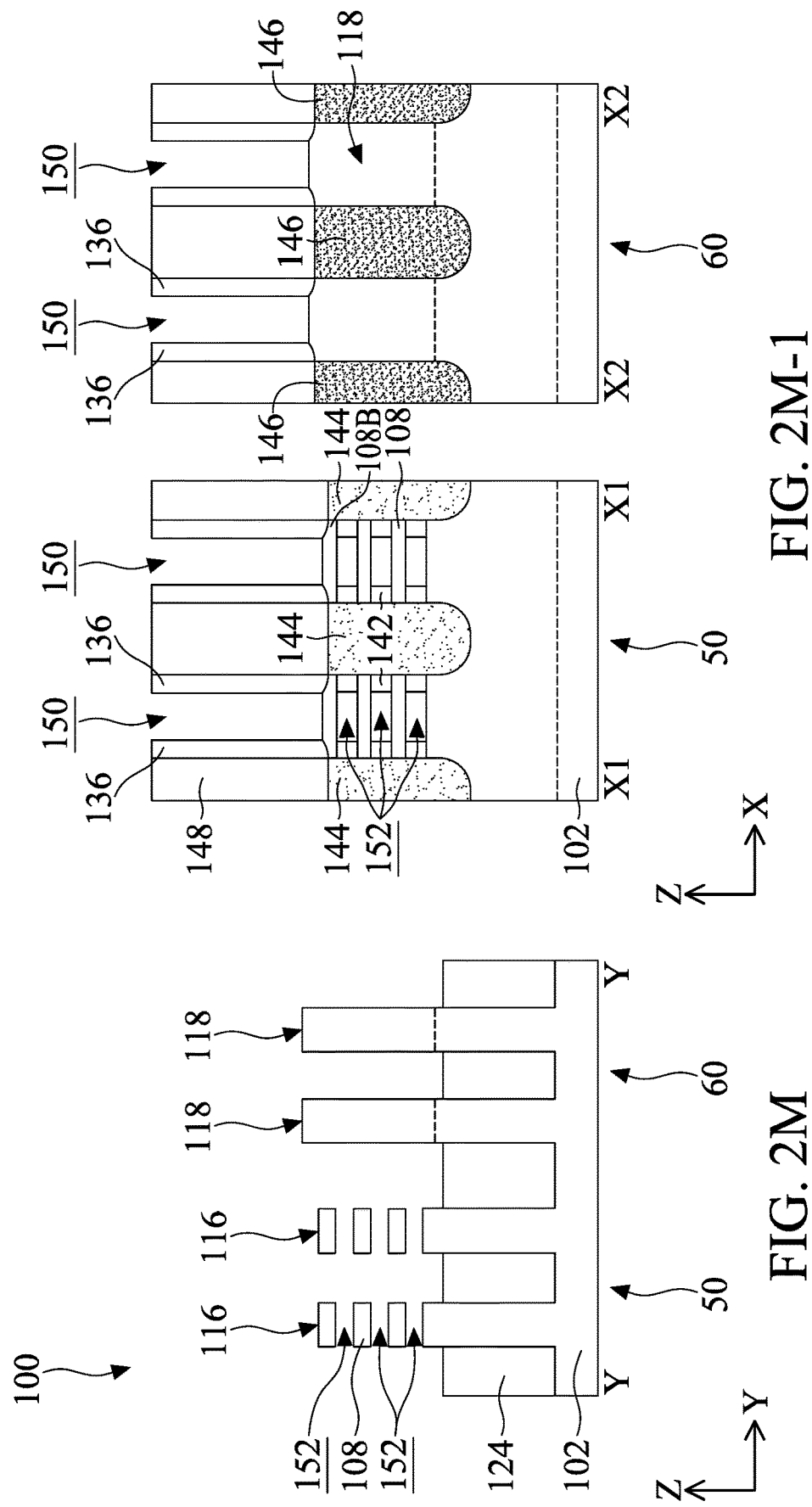

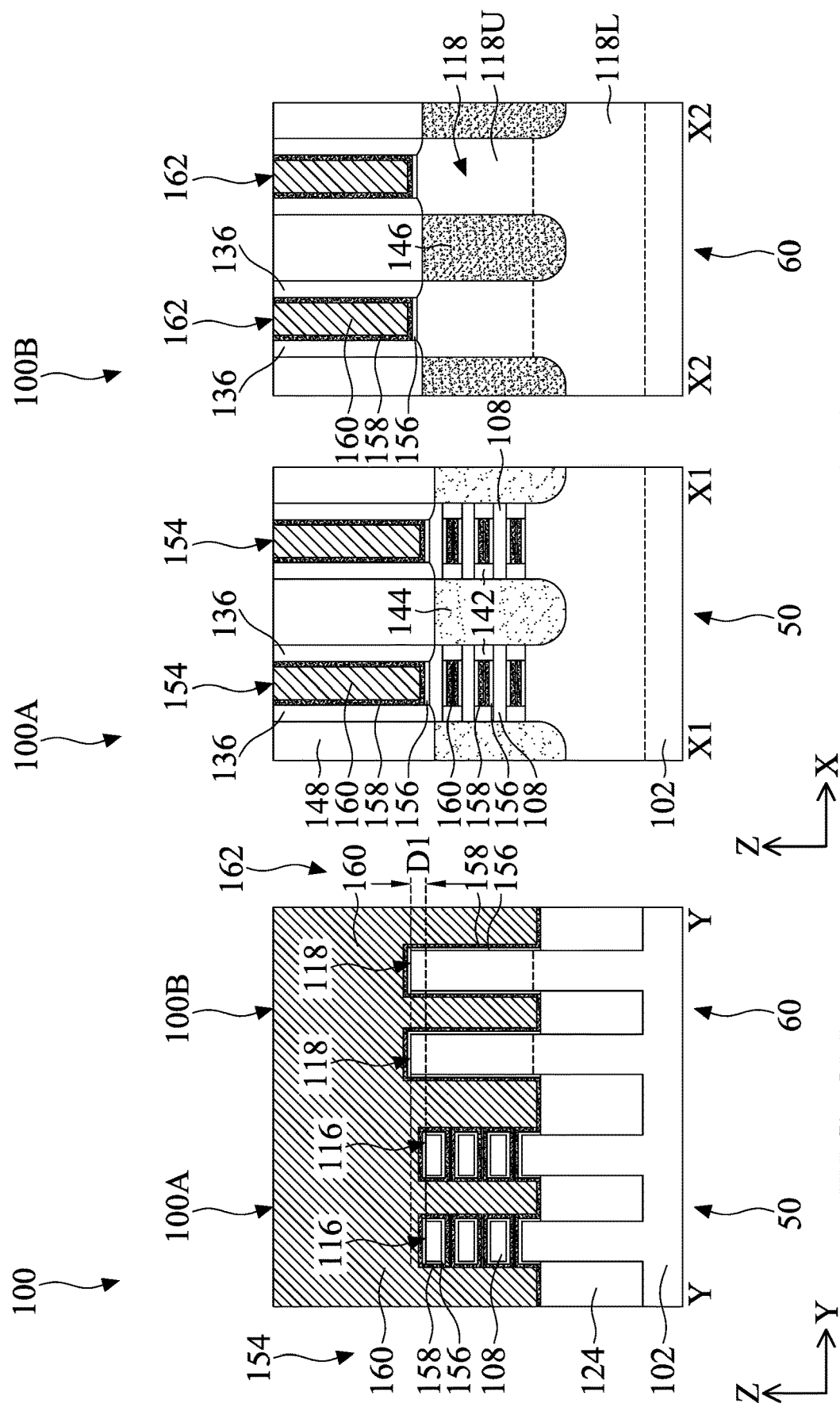

SEMICONDUCTOR STRUCTURE AND METHOD FOR FORMING THE SAME

BACKGROUND

The electronics industry is experiencing an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled-down while maintaining gate control and mitigating SCEs. In conventional processes, GAA devices provide a channel in a silicon nanowire. However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A through 2N are cross-sectional views illustrating the formation of a semiconductor structure at various intermediate stages, in accordance with some embodiments of the disclosure.

FIGS. 2J-1 through 2N-1 are cross-sectional views illustrating the formation of a semiconductor structure at various intermediate stages, in accordance with some embodiments of the disclosure.

DETAILED DESCRIPTION

Figure 1:
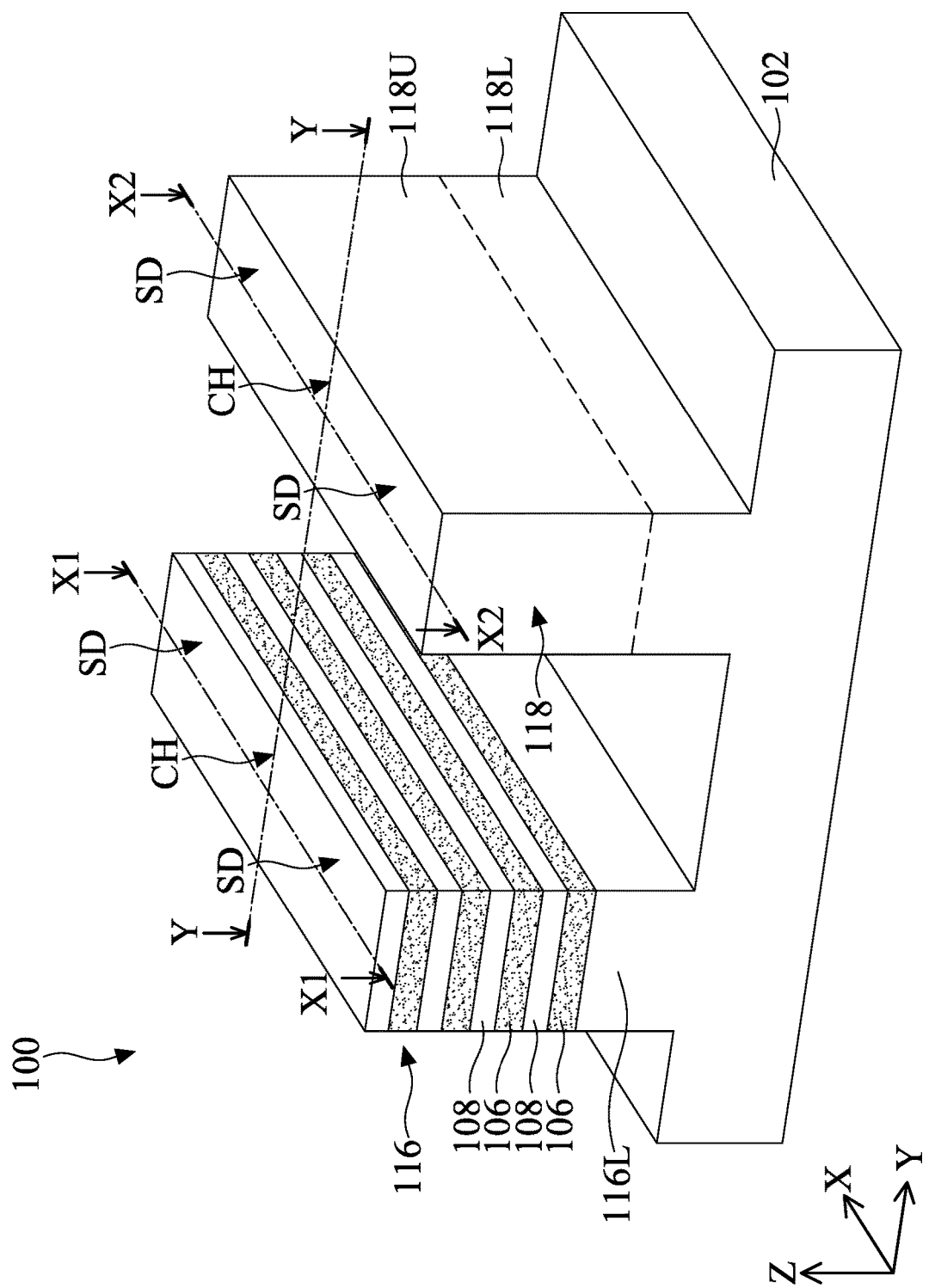
FIG. 1 is a perspective view of a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Fin field effect transistors (FinFETs) are widely used in integrated circuits (ICs) including different type of devices, e.g., logic devices, memory devices such as static random access memory (SRAM), etc. For example, p-type and n-type field-effect transistors (FETs) are expected to exhibit a balanced switching performance (e.g., turn ON and OFF characteristics) within the logic and static access memory (SRAM) regions of a chip. However, due to semiconductor devices scaling, p-type FETs (PFETs) and n-type FETs (NFETs) may develop a performance mismatch. In addition, FET scaling may result in short channel effects when the gate electrode loses control of the channel region. Aggressively scaling in FinFETs may result in drain induced barrier lowering (DIBL).

Gate-all-around FETs (GAA FETs) can exhibit improved gate control over its channel region (e.g., low DIBL) than FinFET. The aspect of the embodiments of the present disclosure is direct to a formation method and structures that provide hybrid structures including n-channel gate-all-around field-effect transistors (GAA FETs) and p-channel FinFETs formed over the same semiconductor substrate (or chip), thereby enhancing the electrical performance of the devices. Furthermore, the method of the embodiments of the present disclosure may utilize an uppermost second semiconductor and an uppermost first semiconductor layer as a dummy layer and a polishing stop layer respective for a planarization process. As such, a nanostructure of the gateall-around FET may have a stable thickness, thereby reducing the performance fluctuation of the devices.

FIG. 1 is a perspective view of a semiconductor structure, in accordance with some embodiments of the disclosure. A semiconductor structure 100 is provided, as shown in FIG. 1, in accordance with some embodiments. The semiconductor structure 100 includes a substrate 102, and a first fin structure 116 and a second fin structure 118 over the substrate 102, in accordance with some embodiments. For example, the first fin structure 116 may be used to form gate-all-around field-effect transistor (GAA FET), and the second fin structure 118 may be used to form FinFET.

For a better understanding of the semiconductor structure, FIG. 1 illustrates an X-Y-Z coordinate reference that is used in later figures. X-axis and Y-axis are generally orientated along the lateral directions that are parallel to the main surface of the substrate 102. Y-axis is transverse (e.g., substantially perpendicular) to the X-axis. Z-axis is generally oriented along the vertical direction that is perpendicular to the main surface of the substrate 102 (or the X-Y plane).

The first fin structure 116 includes a lower fin element 116L formed from a portion of the substrate 102 and an upper fin element formed from an epitaxial stack including alternating first semiconductor layers 106 and second semiconductor layer 108, in accordance with some embodiments. The second fin structure 118 includes a lower fin element 118L formed from a portion of the substrate 102 and an upper fin element 118U formed from a third semiconductor layer, in accordance with some embodiments.

The fin structures 116 and 118 extend in the X direction, in accordance with some embodiments. That is, the fin structures 116 and 118 each have a longitudinal axis parallel to X direction, in accordance with some embodiments. The X direction may also be referred to as the channel-extending direction. Each of the fin structures 116 and 118 includes a channel region CH and source/drain regions SD, where the channel region CH is defined between the source/drain regions SD, in accordance with some embodiments. FIG. 1 shows one channel region CH and two source/drain regions SD for illustrative purpose and is not intended to be limiting. The number of the channel region CH and the source/drain region SD may be dependent on the semiconductor device design demand and/or performance consideration. Gate structures (not shown) will be formed with a longitudinal axis parallel to Y direction and extending across the channel regions CH of the fin structures 116 and 118. As such, Y direction may also be referred to as a gate-extending direction.

FIG. 1 further illustrates a reference cross-section that is used in later figures. Cross-sections X1-X1 and X2-X2 are in plans along the longitudinal axes of the first fin structure 116 and the second fin structure 118, respectively, in accordance with some embodiments. Cross-section Y-Y is in a plane across the channel region CH of the fin structures 116 and 118 and is along the longitudinal axis of a gate structure, in accordance with some embodiments.

Figure 2B:
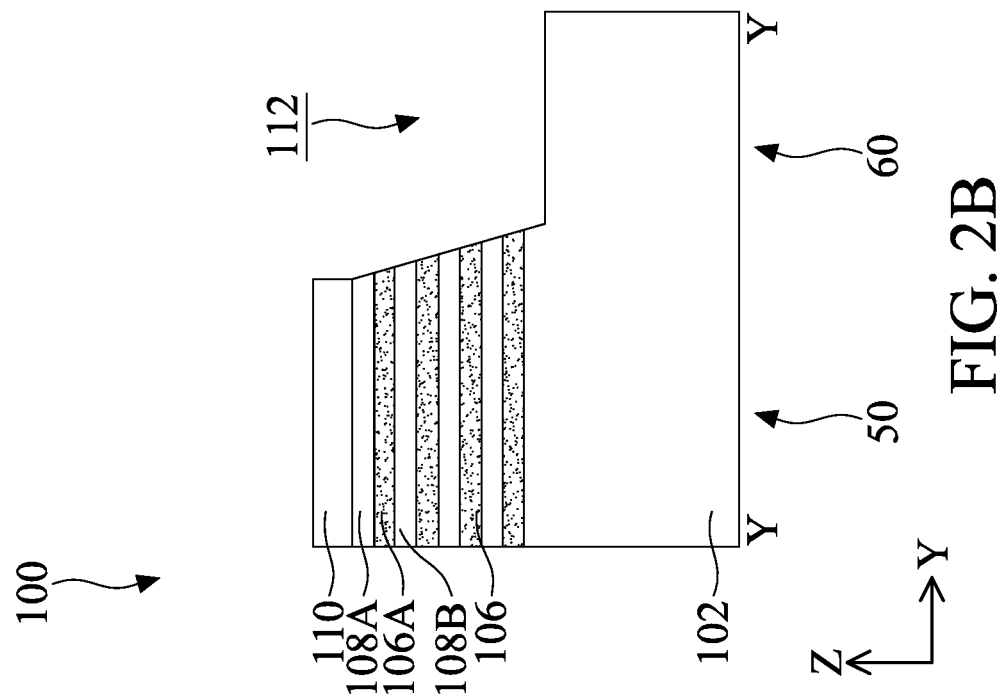
Figure 2A:
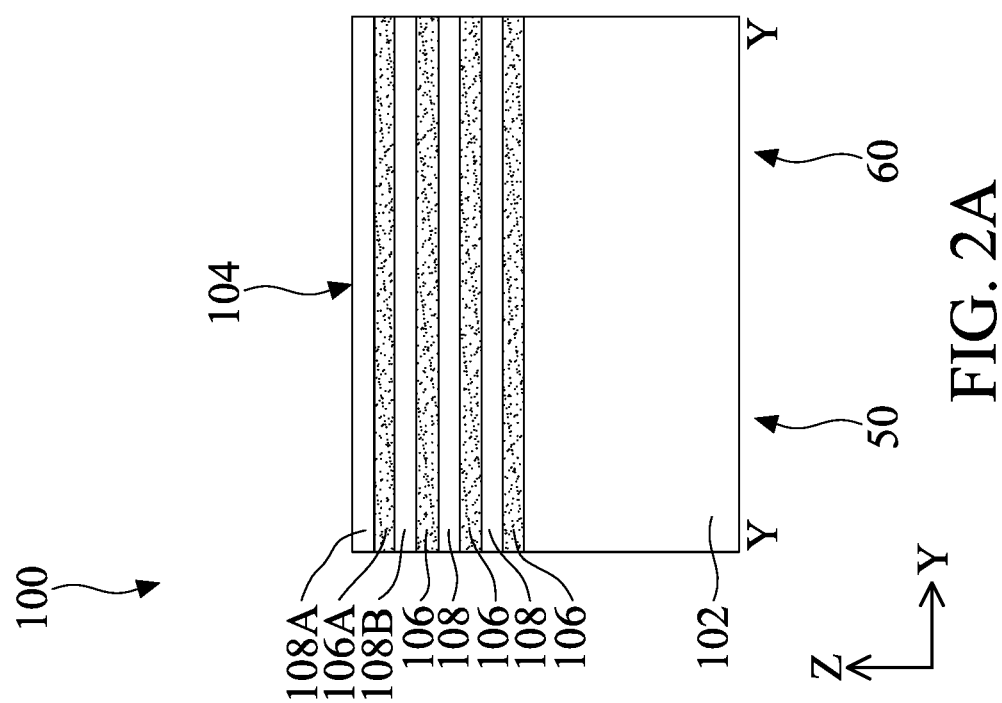

FIGS. 2A through 2N are cross-sectional views illustrating the formation of a semiconductor structure at various intermediate stages taken along line Y-Y shown in FIG. 1, in accordance with some embodiments of the disclosure. FIGS. 2J-1 through 2N-1 are cross-sectional views illustrating the formation of a semiconductor structure at various intermediate stages taken along lines X1-X1 and X2-X2 shown in FIG. 1, in accordance with some embodiments of the disclosure.

FIG. 2A is a cross-sectional view of a semiconductor structure 100 after the formation of an epitaxial stack 104, in accordance with some embodiments. A substrate 102 is provided, as shown in FIG. 2A, in accordance with some embodiments. The substrate 102 includes an NMOS region 50 where gate-all-around FET devices are to be formed and a PMOS region 60 where the FinFET devices are to be formed, in accordance with some embodiments. In some embodiments, the NMOS region 50 is located adjacent to the PMOS region 60.

In some embodiments, the substrate 102 is a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof. Furthermore, the substrate 102 may optionally include an epitaxial layer (epi-layer), may be strained for performance enhancement, may include a silicon-on-insulator (SOI) structure, and/or have other suitable enhancement features.

An epitaxial stack 104 is formed over the substrate 102, as shown in FIG. 2A, in accordance with some embodiments. The epitaxial stack 104 is a superlattice structure including first semiconductor layers 106 and second semiconductor layers 108 are alternatingly formed over the substrate 102, in accordance with some embodiments. The uppermost second semiconductor layers 108 is denoted as 108A and configured as a dummy layer in a subsequent planarization process. The uppermost first semiconductor layer 106, immediately below the dummy layer 108A, is denoted as 106A and configured as a polishing stop layer in the subsequent planarization process. Furthermore, the second uppermost second semiconductor layers 108, immediately below the polishing stop layer 106A, is denoted as 108B and configured as the top active layer of a subsequently formed nanostructure.

In some embodiments, the thickness (along Z direction) of each of the first semiconductor layers 106 is in a range from about 1.5 nm to about 20 nm. In some embodiments, the thickness (along Z direction) of each of the second semiconductor layers 108 is in a range from about 1.5 nm to about 20 nm.

The first semiconductor layers 106 have a different lattice constant than the second semiconductor layers 108, in accordance with some embodiments. In some embodiments, the first semiconductor layers 106 have a different oxidation rate and/or etching selectivity than the second semiconductor layers 108. In some embodiments, the first semiconductor layers 106 (including polishing stop layer 106A) are made of silicon germanium (SiGe), where the percentage of germanium (Ge) in the SiGe is in a range from about 20 atomic % to about 80 atomic %, and the second semiconductor layers 108 (including dummy layer 108A and top active layer 108B) are made of silicon (Si). In some embodiments, the first semiconductor layers 106 and the second semiconductor layers 108 are formed using an epitaxial growth process such as molecular beam epitaxy (MBE), metal organic chemical vapor deposition (MOCVD), or vapor phase epitaxy (VPE), or another suitable technique.

As explained in detail below, the first semiconductor layers 106 will be removed, and all the second semiconductor layers 108 but dummy layer 108A form nanostructures (e.g., nanowire or nanosheet structures) that laterally extend between source/drain features and serve as the channel layers for the resulting transistors such as gate-all-around transistors, in accordance with some embodiments. As the term is used herein, "nanostructures" refers to semiconductor layers that have cylindrical shape, bar shaped and/or sheet shape. Gate stack (not shown) will be formed across and wrap around the nanostructures and interpose source/drain features, in accordance with some embodiments.

FIG. 2B is a cross-sectional view of a semiconductor structure 100 after the formation of a recess 112, in accordance with some embodiments. A patterned mask layer 110 is formed over the upper surface of the dummy layer 108A, as shown in FIG. 2B, in accordance with some embodiments. The patterned mask layer 110 is formed to cover the NMOS region 50 and exposes the PMOS region 60, in accordance with some embodiments.

In some embodiments, the patterned mask layer 110 is a hard mask layer made of dielectric material, such as silicon oxide, silicon nitride, silicon oxynitride (SiON), another suitable dielectric material. In an embodiment, the patterned mask layer 110 is a silicon oxide layer. In some embodiments, the patterned mask layer 110 is formed using a deposition process and a patterning process. The deposition process may be chemical vapor deposition (CVD) (such as low pressure CVD (LPCVD) or plasma enhanced CVD (PECVD)), atomic layer deposition (ALD), another suitable technique, and/or a combination thereof. The patterning process may include photolithography process to form a patterned photoresist layer over the dielectric material and an etching process to remove a portion of the dielectric material at the PMOS region 60 to form the patterned mask layer 110.

An etching process is performed on the semiconductor structure 100 to remove a portion of the epitaxial stack 104 (including the dummy layer 108A and the polishing stop layer 106A) uncovered by the patterned mask layer 110, thereby forming a recess 112 at the PMOS region 60, as shown in FIG. 2B, in accordance with some embodiments. In some embodiments, the recess 112 extends into the substrate 102 to prevent leakage between resulting NMOS and PMOS devices. That is, in some embodiments, the bottom surface of the recess 112 is located at a lower level than the bottom surface of lowermost first semiconductor layer 106 of the epitaxial stack 104. The etching process may be an anisotropic etching process such as a dry plasma etching. An etching depth may be controlled, e.g., by controlling an etching time or by using an endpoint detector.

FIG. 2C is a cross-sectional view of a semiconductor structure 100 after the formation of a third semiconductor layer 114, in accordance with some embodiments. A third semiconductor layer 114 is deposited from the recess 112, as shown in FIG. 2C, in accordance with some embodiments. In some embodiments, the third semiconductor layer 114 is formed with an upper surface higher than the upper surface of the polishing stop layer 108A. That is, the upper surface of the third semiconductor layer 114 is not lower than the bottom surface of the dummy layer 108A.

The third semiconductor layer 114 is made of silicon, in accordance with some embodiments. The third semiconductor layer 114 is formed using an epitaxial growth process such as MBE, MOCVD, or VPE, or another suitable technique. Because the patterned mask layer 110 is made of a dielectric material, the third semiconductor layer 114 may not formed over the patterned mask layer 110. The patterned mask layer 110 may be removed using an etching process after the third semiconductor layer 114 is formed.

In some embodiments, the third semiconductor layer 114 is doped with an n-type dopant (e.g., phosphorus (P) or arsenic (As)) during the epitaxial growth process. In some embodiments, the third semiconductor layer 114 has the same conductivity type (such as n-type) as the substrate 102 and has a higher dopant concentration. In some embodiments, the third semiconductor layer 114 has the opposite conductivity type as the substrate 102.

FIG. 2D is a cross-sectional view of a semiconductor structure 100 after a planarization process, in accordance with some embodiments. A planarization process (e.g., chemical mechanical polish (CMP)) is performed on the semiconductor structure 100 to remove portions of the epitaxial stack 104 and the third semiconductor layer 114, as shown in FIG. 2D, in accordance with some embodiments. Specifically, the planarization process removes the dummy layer 108A along with a portion of the third semiconductor layer 114 above the polishing stop layer 106A, until the polishing stop layer 106A is exposed, in accordance with some embodiments. After the planarization process, the upper surface of the polishing stop layer 106A is substantially coplanar with the upper surface of the third semiconductor layer 114, in accordance with some embodiments.

The polishing stop layer 106A (made of SiGe) has a different polishing selectivity with respect to the dummy layer 108A and the third semiconductor layer 114 (both made of Si), which is helpful for deciding when to stop the planarization process, in accordance with some embodiments. For example, the CMP process may initially polish the silicon from the dummy layer 108A and the third semiconductor layer 114 and be stopped when it is detected a sharp decrease in the polishing rate due to different polishing selectivity between silicon germanium and silicon.

By utilizing the uppermost first semiconductor layer 106A as a polishing stop layer, the top active layer 108B of the epitaxial stack 104, which will be an uppermost channel of a gate-all-around FET, may be formed with a precisely controlled thickness. If the planarization process polishes to the top active layer 108B, it is hard to precisely control the remaining thickness of the top active layer 108B because the second semiconductor layers 108 and the third semiconductor layer 114 both are made of silicon. The top active layer 108B with unstable thickness may cause fluctuation of device performance. If an uppermost channel of a gate-all-around FET is too thick, drain induced barrier lowering (DIBL) of devices may worsen, e.g., increasing leakage at OFF-state. If an uppermost channel of a gate-all-around FET is too thin, the performance of the devices may be degraded, e.g., increasing channel resistance and/or decreasing effective current.

Therefore, the thickness of the top active layer 108B can be decided and precisely controlled in the epitaxial growth process of the epitaxial stack 104 and be kept stable during the manufacturing processes after the epitaxial growth process of the epitaxial stack 104.

FIG. 2E is a cross-sectional view of a semiconductor structure 100 after the formation of first fin structures 116 and second fin structures 118, in accordance with some embodiments. The epitaxial stack 104 in the NMOS region 50, the third semiconductor layer 114 in the PMOS region 60 and the underlying substrate 102 are patterned to form first fin structures 116 in the NMOS region 50 and second fin structures 118 in the PMOS region 60, as shown in FIG. 2E, in accordance with some embodiments. The fin structures 116 and 118 are active regions of the semiconductor structure 100, which are to be formed into channel regions of transistors, e.g., gate-all-around FETs and FinFETs, in accordance with some embodiments.

The fin structures 116 and 118 extend in the X direction and are arranged substantially parallel with one another in the Y direction, in accordance with some embodiments. That is, the fin structures 116 and 118 have longitudinal axes parallel to the X direction, in accordance with some embodiments. In some embodiments, the dimension of the first fin structures 116 along Y direction is in a range from about 15 nm to about 90 nm. In some embodiments, the dimension of the second fin structures 118 along Y direction is in a range from about 15 nm to about 90 nm.

In some embodiments, the patterning process includes forming a patterned mask layer over the semiconductor structure 100, and etching the semiconductor structure 100 uncovered by the patterned hard mask layer, thereby forming trenches and the fin structures 116 and 118. In some embodiments, the patterned mask layer is a multilayer structure such as including an oxide layer (e.g., silicon oxide) 120 and a nitride layer (silicon nitride) 122 over the oxide layer 120. The etching process may be an anisotropic etching process, e.g., dry plasma etching.

After the etching process, the substrate 102 has portions protruding from between the trenches to form lower fin elements 116L of the first fin structures 116 and lower fin elements 118L of the second fin structures 118, in accordance with some embodiments. A remainder of the epitaxial stack 104 (including the first semiconductor layers 106 and second semiconductor layers 108) forms upper fin elements of the first fin structures 116 over the lower fin elements 116L. In some embodiments, a remainder of the third semiconductor layer 114 forms upper fin elements 118U of the second fin structures 118 over the lower fin elements 118L.

In some embodiments, the upper fin elements 118U have the same conductivity type (such as n-type) as the lower fin elements 118L and have a higher dopant concentration. In some embodiments, the lower fin elements 118L have the opposite conductivity type as lower fin elements 118L.

FIG. 2F is a cross-sectional of a semiconductor structure 100 after the formation of an insulating material 123, in accordance with some embodiments. An insulating material 123 is formed over the substrate 102 and surrounds the fin structures 116 and 118, as shown in FIG. 2F, in accordance with some embodiments.

In some embodiments, the insulating material 123 is silicon oxide, silicon nitride, silicon oxynitride (SiON), another suitable insulating material, multilayers thereof, and/or a combination thereof. In some embodiments, the formation of the insulating material 123 includes depositing one or more insulating material for the insulating material 123 over the semiconductor structure 100 to fill the trenches, and planarizing the insulating material 123 to remove portions of the insulating material above the nitride layer 122 of the patterned mask layer. In some embodiments, the deposition process includes CVD (such as LPCVD, PECVD, high density plasma CVD (HDP-CVD), high aspect ratio process (HARP), or flowable CVD (FCVD)), atomic layer deposition (ALD), another suitable technique, and/or a combination. The planarization may be CMP.

Figure 2G:
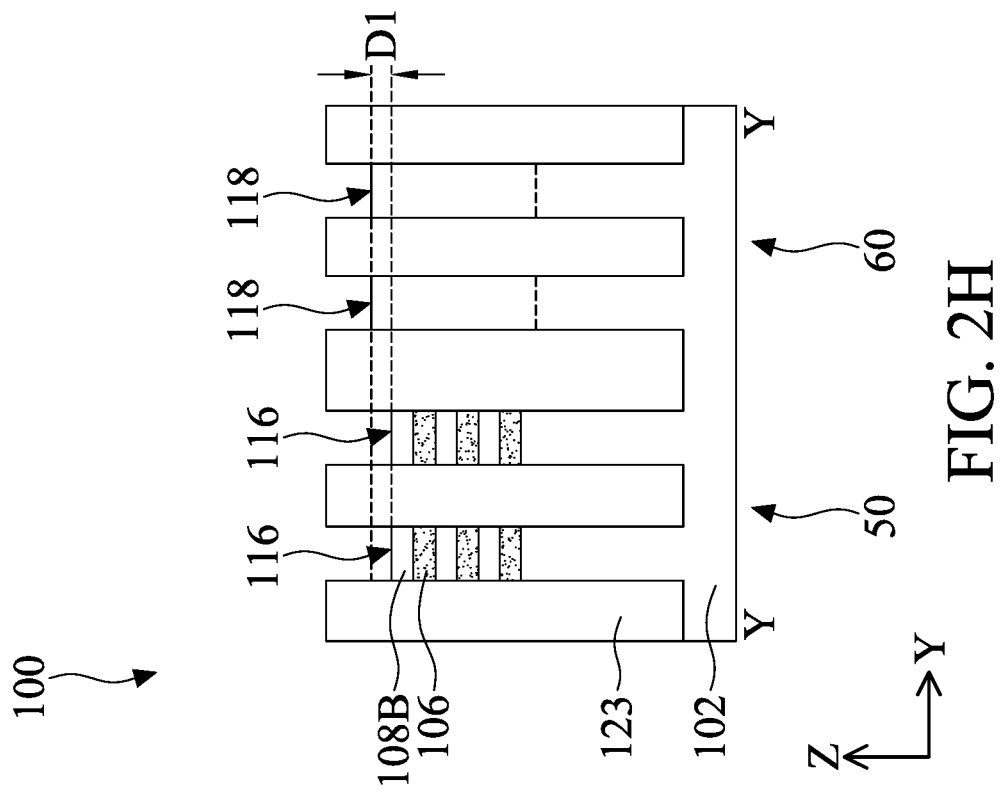

FIG. 2G is a cross-sectional of a semiconductor structure 100 after the removal of the patterned mask layer, in accordance with some embodiments. One or more etching process is performed on the semiconductor structure 100 to remove the patterned mask layer including the oxide layer 120 and nitride layer 122, as shown in FIG. 2G in accordance with some embodiments. The etching process is performed until the polishing stop layers 106A of the first fin structures 116 and the upper fin elements 118L (third semiconductor layer 114) of the second fin structures 118 are exposed, in accordance with some embodiments. The one or more etching process may be an isotropic etching process such dry chemical etching (e.g., remote plasma etching) or wet etching.

Figure 2H:
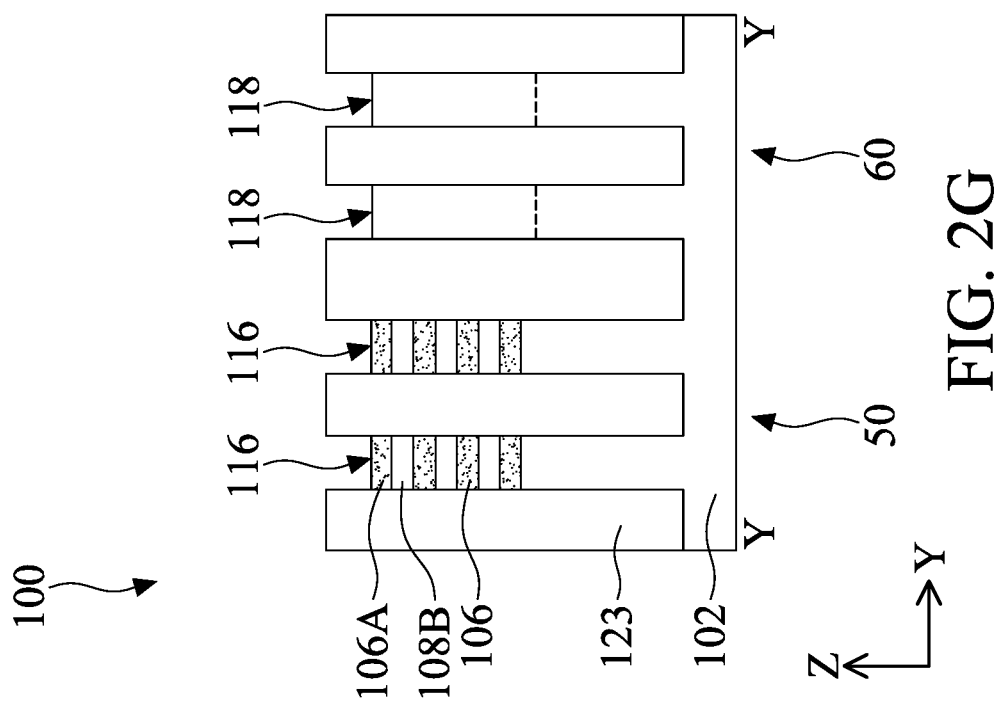

FIG. 2H is a cross-sectional of a semiconductor structure 100 after the removal of the polishing stop layer 106A, in accordance with some embodiments. An etching process is performed on the semiconductor structure 100 to remove the polishing stop layers 106A of the first fin structures 116, as shown in FIG. 2H, in accordance with some embodiments. The etching process is performed until the top active layers 108B of the first fin structures 116 is exposed, in accordance with some embodiments. In some embodiments, the etching process is a wet etching. In some embodiments, the etching process uses etchants such as ammonium hydroxide ($NH_4OH$), tetramethylammonium hydroxide (TMAH) solution, ethylenediamine pyrocatechol (EDP), and/or potassium hydroxide (KOH) solutions.

Because the polishing stop layer 106A (made of SiGe) has a different etching selectivity with respect to the second semiconductor layer 108 and the third semiconductor layer 114 (both made of Si) in the etching process, the second semiconductor layer 108 and the third semiconductor layer 114 may be substantially unconsumed or removed slightly (e.g., loss in thickness less than 1 nm) in the etching process. Therefore, the thickness of top active layers 108B of the first fin structures 116 can be kept stable during the etching process.

After the etching process, the upper surface of the second fin structure 118 is located at a higher level than the upper surface of the first fin structure 116 by a distance D1, in accordance with some embodiments. In some embodiments, the distance D1 is in a range from about 2 nm to about 12 nm. That is, after the etching process, the second fin structure 118 is taller than the first fin structure 116.

Figure 2I:
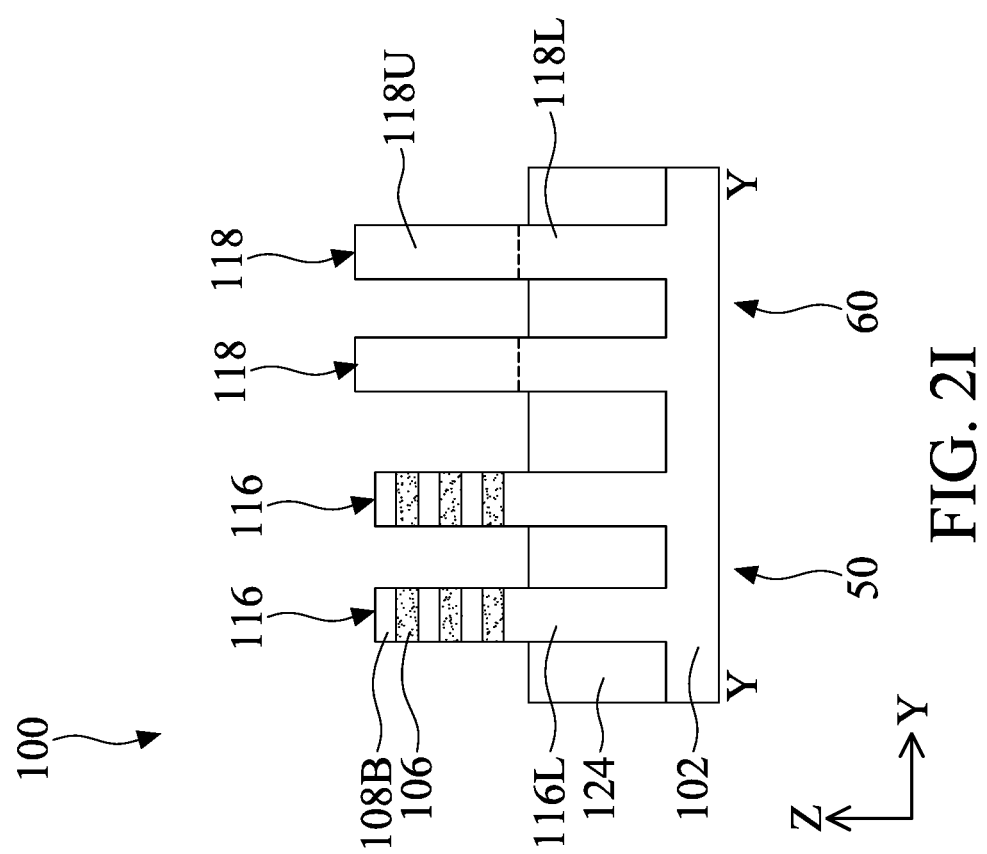

FIG. 2I is a cross-sectional of a semiconductor structure 100 after the formation of the isolation structure 124, in accordance with some embodiments. The insulating material 123 is recessed, thereby forming an isolation structure 124, as shown in FIG. 2I, in accordance with some embodiments. The isolation structure 124 exposes portions of the sidewalls of the fin structures 116 and 118, in accordance with some embodiments. The isolation structure 124 is configured to electrically isolate the active regions (e.g., the first fin structures 116 and the second fin structures 118) and is also referred to as shallow trench isolation (STI) feature, in accordance with some embodiments. A recessing depth may be controlled (e.g., by controlling an etching time) so as to result in a desired height of the exposed portion of the fin structures 116 and 118. In some embodiments, the upper fin elements including the first semiconductor layers 106 and the second semiconductor layers 108 and the upper fin elements 118U including the third semiconductor layer 114 are exposed from the isolation structure 124.

FIGS. 2J and 2J-1 are cross-sectional of a semiconductor structure 100 after the formation of dummy gate structures 126 and gate spacer layers 136, in accordance with some embodiments. Dummy gate structures 126 are formed over the semiconductor structure 100, as shown in FIGS. 2J and 2J-1, in accordance with some embodiments. In some embodiments, the dummy gate structures 126 extend in Y direction and are arranged along X direction. That is, the dummy gate structures 126 have longitudinal axes parallel to Y direction, in accordance with some embodiments. The dummy gate structures 126 extend across and wrap the channel regions of the fin structures 116 and 118, in accordance with some embodiments.

The dummy gate structures 126 each includes a dummy gate dielectric layer 128 and a dummy gate electrode layer 130 formed over the dummy gate dielectric layer 128, as shown in FIGS. 2J and 2J-1, in accordance with some embodiments. In some embodiments, the dummy gate dielectric layers 128 are made of one or more dielectric materials, such as silicon oxide (SiO), silicon nitride (SiN), silicon oxynitride (SiON), $HfO_2$, HfZrO, HfSiO, HfTiO, HfAlO, and/or a combination thereof. In some embodiments, the dielectric material is formed using ALD, CVD, thermal oxidation, physical vapor deposition (PVD), another suitable technique, and/or a combination thereof. In some embodiments, the dummy gate electrode layers 130 are made of a semiconductor material, such as polysilicon, poly-silicon germanium, and/or a combination thereof. In some embodiments, the conductive material is formed using CVD, another suitable technique, and/or a combination thereof.

In some embodiments, the formation of the dummy gate structures 126 includes conformally depositing a dielectric material for the dummy gate dielectric layer 128 over the semiconductor structure 100, depositing a conductive material for the dummy gate electrode layer 130 over the dielectric material, planarizing the conductive material, and patterning the conductive material and dielectric material into the dummy gate structures 126. The patterning process may include forming patterned mask layer over the conductive material to cover the channel regions of the fin structures 116 and 118. In some embodiments, the patterned mask layer is a multilayer structure including a nitride layer (e.g., silicon nitride) 132 and an oxide layer (silicon oxide) 134 over the nitride layer 132. The conductive material and dielectric material, uncovered by the patterned mask layer, may be etched away to expose the source/drain regions of the fin structures 116 and 118. The etching process may slightly recess the fin structures 116 and 118, thereby forming a gate-footing profile.

Gate spacer layers 136 are formed along and cover opposite sidewalls of the dummy gate structures 126, as shown in FIG. 2J-1, in accordance with some embodiments. The gate spacer layers 136 are configured to offset the subsequently formed source/drain features and separate the source/drain features from the gate structure.

In some embodiments, the gate spacer layers 136 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. In some embodiments, the formation of the gate spacer layers 136 includes conformally depositing a dielectric material for the gate spacer layers 136 over the semiconductor structure 100 followed by an anisotropic etching process such as dry plasma etching. In some embodiments, the etching process is performed to remove horizontal portions of the dielectric material for the gate spacer layers 136, while leaving vertical portions of the dielectric material on sidewalls of the dummy gate structure 126 to act as the gate spacer layers 136.

FIGS. 2K and 2K-1 are cross-sectional of a semiconductor structure 100 after the formation of source/drain recesses 138 and 140 and inner spacer layers 142, in accordance with some embodiments. The source/drain region of the fin structures 116 and 118 are recessed, thereby forming first source/drain recesses 138 through the first fin structures 116 and second first source/drain recesses 140 through the second fin structures 118, as shown in FIG. 2K-1, in accordance with some embodiments. The etching process may be anisotropic etching process, e.g., dry plasma etching, and uses the dummy gate structures 126 along with the gate spacer layers 136 as etching masks. A recessing depth may be dependent on a desired height of the source/drain features for performance consideration. In some embodiments, the recessing depth (the bottom surfaces of the recesses 138 and 140) is located at a lower level than the upper surface of the isolation structure 124.

An etching process is performed on the semiconductor structure 100 to laterally recess the first semiconductor layers 106 of the first fin structures 116 from the source/drain recesses 138, thereby forming notches (not shown), in accordance with some embodiments. Inner spacer layers 142 are then formed to fill the notches, as shown in FIG. 2K-1, in accordance with some embodiments. The inner spacer layers 142 are aligned below the gate spacer layers 136 and abut the first semiconductor layers 106, in accordance with some embodiments. The inner spacer layers 142 interpose subsequently formed source/drain features and gate stacks and are configured to reduce the parasitic capacitance between the metal gate stack and the source/drain features (i.e. Cgs and Cgd) and configured as an etching stop layer in a subsequently channel releasing process, in accordance with some embodiments.

In some embodiments, the inner spacer layers 142 are made of a dielectric material, such as silicon oxycarbide (SiOC), silicon oxide carbonitride (SiOCN), silicon carbon nitride (SiCN), and/or a combination thereof, in accordance with some embodiments. In some embodiments, the inner spacer layers 142 are formed by depositing a dielectric material for the inner spacer layers 142 over the semiconductor structure 100 to fill the notches and then etching back the dielectric material to remove the dielectric material outside the notches. In some embodiments, the deposition process includes ALD, CVD (such as PECVD or LPCVD), another suitable technique, and/or a combination thereof. In some embodiments, the etching-back process includes a plasma dry etching, a dry chemical etching, and/or a wet etching.

In an instance where the polishing stop layer 106A (FIG. 2G) is not removed, the polishing stop layer 106A may be thinned down by the etching process for forming the dummy gate structures 126. As such, the polishing stop layer 106A is also laterally recessed to form a top notch which may have a smaller size than other notches formed by laterally recessing the first semiconductor layer 106, and therefore the inner spacer layer may not be able to formed in the top notch, resulting in damage to the source/drain feature (e.g., pit defects) during a subsequently channel releasing process.

FIGS. 2L and 2L-1 are cross-sectional of a semiconductor structure 100 after the formation of source/drain features 144 and 146 and an interlayer dielectric (ILD) layer 148, in accordance with some embodiments. First source/drain features 144 are formed over the first fin structures 116 from the first source/drain recesses 138, and second source/drain features 146 are formed over the second fin structures 118 from the second source/drain recesses 144, as shown in FIG. 2L-1, in accordance with some embodiments. The source/drain features 144 and 146 are formed on opposite sides of the dummy gate structure 126, in accordance with some embodiments. In some embodiments, the upper surfaces of the second source/drain features 146 are located at a higher level than the upper surface of the first source/drain feature 144.

One or more semiconductor material for the source/drain features 144 and 146 are grown on the fin structures 116 and 118 using epitaxial growth processes, in accordance with some embodiments. The epitaxial growth process may be MBE, MOCVD, or VPE, another suitable technique, or a combination thereof. In some embodiments, the source/drain features 144 and 146 are made of any suitable material for n-type semiconductor devices and p-type semiconductor devices respectively, such as Ge, Si, GaAs, AlGaAs, SiGe, GaAsP, SiP, SiC, SiCP, or a combination thereof. The source/drain features 144 and 146 may be formed separately for n-channel FET and p-channel FET. In some embodiments, the source/drain features 144 and 146 are doped in-situ during the respective epitaxial growth processes.

In some embodiments, the first source/drain features 144 are made of semiconductor material such as SiP, SiCP, SiC, Si, GaAs, another suitable semiconductor material, or a combination thereof. In some embodiments, the first source/drain features 144 are doped with an n-type dopant during the epitaxial growth process. For example, the first source/drain features 144 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features.

In some embodiments, the second source/drain features 146 are made of semiconductor material such as SiGe, Si, GaAs, another suitable semiconductor material, or a combination thereof. In some embodiments, the second source/drain features 146 are doped with a p-type dopant during the epitaxial growth process. For example, the second source/drain features 146 may be the epitaxially grown SiGe doped with boron (B).

An interlayer dielectric layer 148 is formed over the semiconductor structure 100, as shown in FIGS. 2L-1, in accordance with some embodiments. The interlayer dielectric layer 148 fills the space between dummy gate structures 126, thereby covering the source/drain features 144 and 146, in accordance with some embodiments.

In some embodiments, the interlayer dielectric layer 148 is made of a dielectric material, such as un-doped silicate glass (USG), or doped silicon oxide such as borophosphosilicate glass (BPSG), fluoride-doped silicate glass (FSG), phosphosilicate glass (PSG), borosilicate glass (BSG), and/or another suitable dielectric material. In some embodiments, the interlayer dielectric layer 148 is a multilayer structure including a nitride liner as an contact etching stop layer (CESL) and an oxide bulk layer over the nitride liner. In some embodiments, a dielectric material for the interlayer dielectric layer 148 is deposited using such as CVD (such as HDP-CVD, PECVD, or HARP), another suitable technique, and/or a combination thereof.

Afterward, the dielectric material for the interlayer dielectric layer 148 above the upper surfaces of the dummy gate electrode layers 130 is removed using such as CMP until the upper surfaces of the dummy gate structures layers 130 are exposed. In some embodiments, the patterned mask layer including the nitride layer 132 and the oxide layer 134 are also removed. In some embodiments, the upper surface of the interlayer dielectric layer 148 is substantially coplanar with the upper surfaces of the dummy gate electrode layers 130.

FIGS. 2M and 2M-1 are cross-sectional of a semiconductor structure 100 after the removal of the dummy gate structures 126 and the first semiconductor layers 106, in accordance with some embodiments. A channel releasing process is performed on the semiconductor structure 100, in accordance with some embodiments. The dummy gate structures 126 are first removed using an etching process to form gate trenches 150, as shown in FIGS. 2M-1 to 2M-1, in accordance with some embodiments. The gate trenches 150 expose the channel regions of the fin structures 116 and 118, in accordance with some embodiments. In some embodiments, the gate trenches 150 expose the inner sidewalls of the gate spacer layers 136 facing the channel regions, in accordance with some embodiments.

In some embodiments, the etching process includes one or more etching processes. For example, when the dummy gate electrode layers 130 are made of polysilicon, a wet etchant such as a tetramethylammonium hydroxide (TMAH) solution may be used to selectively remove the dummy gate electrode layers 130. For example, the dummy gate dielectric layers 128 may be thereafter removed using a dry plasma etching, a dry chemical etching, and/or a wet etching.

The channel releasing process also includes removing the first semiconductor layers 106 using an etching process, thereby forming gaps 152, as shown in FIGS. 2M and 2M-1, in accordance with some embodiments. The gaps 152 are formed between the neighboring second semiconductor layers 108 and between the lowermost second semiconductor layers 108 and the lower fin element 116L, in accordance with some embodiments. In some embodiments, the gaps 152 expose the inner sidewalls of the inner spacer layers 142 facing the channel regions, in accordance with some embodiments.

In some embodiments, the etching process includes a selective wet etching process, such as APM (e.g., ammonia hydroxide-hydrogen peroxide-water mixture) etching process. In some embodiments, the wet etching process uses etchants such as ammonium hydroxide (NH$_4$OH), TMAH, ethylenediamine pyrocatechol (EDP), and/or potassium hydroxide (KOH) solutions.

The inner spacer layers 142 are used as an etching stop layer, preventing the damage to the source/drain features 144 caused by the etching process for forming the gaps 152, in accordance with some embodiments. In an instance where the polishing stop layer 106A (FIG. 2G) is not removed, the polishing stop layer 106A is also etched away by the channel releasing process. As described above, a small-sized top notch formed by laterally recessing the polishing stop layer may be hard to be filled by the inner spacer layer, and therefore, the etchant may flow through the top notch to damage the source/drain features, thereby forming pit defects.

After the etching process, the four main surfaces of the second semiconductor layers 108 of the first fin structures 116 are exposed, in accordance with some embodiments. The exposed second semiconductor layers 108 of the first fin structures 116 form nanostructures that function as channel layers of the resulting semiconductor devices (e.g., gate-all-around FETs), in accordance with some embodiments. In some embodiments, the upper surface of the uppermost nanostructure 108 (e.g., top active layer 108B) is located at a lower level than level with the upper surface of the second fin structure 118.

FIGS. 2N and 2N-1 are cross-sectional of a semiconductor structure 100 after the formation of final gate stacks 154 and 162, in accordance with some embodiments. Interfacial layers 156 are formed on the exposed surfaces of the nanostructures 108, the low fin elements 116L and the second fin structures 118, as shown in FIGS. 2N and 2N-1, in accordance with some embodiments. The interfacial layers 156 wrap around the nanostructures 108 and the second fin structures 118, in accordance with some embodiments.

In some embodiments, the interfacial layers 156 are made of a chemically formed silicon oxide. In some embodiments, the interfacial layers 156 are formed using one or more cleaning processes such as including ozone (O3), ammonia hydroxide-hydrogen peroxide-water mixture, and/or hydrochloric acid-hydrogen peroxide-water mixture. Semiconductor material from the nanostructures 108, the low fin elements 116L and the second fin structures 118 are oxidized to form the interfacial layers 156, in accordance with some embodiments.

High-k dielectric layers 158 are formed conformally along the interfacial layers 156 to wrap around the nanostructures 108 and the second fin structures 118, as shown in FIGS. 2N and 2N-1, in accordance with some embodiments. The interfacial layers 156 and the high-k dielectric layers 158 may collectively be referred to as gate dielectric layers. The high-k dielectric layers 158 are also conformally formed along the inner sidewalls of the gate spacer layers 136 facing the channel region, in accordance with some embodiments. The high-k dielectric layers 158 are also conformally formed along the inner sidewalls of the inner spacer layers 142 facing the channel region, in accordance with some embodiments. The high-k dielectric layers 158 are also conformally formed along the upper surface of the isolation structure 124, in accordance with some embodiments.

In some embodiments, the high-k dielectric layers 158 are made of a dielectric material with high dielectric constant (k value), for example, greater than 3.9. In some embodiments, the high-K dielectric material includes hafnium oxide (HfO$_2$), TiO$_2$, HfZrO, Ta$_2$O$_3$, HfSiO$_4$, ZrO$_2$, ZrSiO$_2$, LaO, AlO, ZrO, TiO, Ta$_2$O$_5$, Y$_2$O$_3$, SrTiO$_3$ (STO), BaTiO$_3$ (BTO), BaZrO, HfZrO, HfLaO, HfSiO, LaSiO, AlSiO, HfTaO, HfTiO, (Ba,Sr)TiO$_3$ (BST), Al$_2$O$_3$, Si$_3$N$_4$, oxynitrides (SiON), a combination thereof, or another suitable material. The high-k dielectric layers 158 may be formed by ALD, PVD, CVD, and/or another suitable technique.

A metal gate electrode layer 160 is formed over the high-k dielectric layers 158 and fills remainders of gate trenches 150 and the gaps 152, as shown in FIGS. 2N and 2N-1, in accordance with some embodiments. The metal gate electrode layer 160 wraps the nanostructures 108 and the second fin structures 118, in accordance with some embodiments. In some embodiments, the metal gate electrode layer 160 continuously extends across the nanostructures 108 and the second fin structures 118.

In some embodiments, the metal gate electrode layer 160 is made of more than one conductive material, such as a metal, metal alloy, conductive metal oxide and/or metal nitride, another suitable conductive material, and/or a combination thereof. For example, the metal gate electrode layer 160 may be made of Ti, Ag, Al, TiAlN, TaC, TaCN, TaSiN, Mn, Zr, TiN, TaN, Ru, Mo, Al, WN, Cu, W, Re, Ir, Co, Ni, another suitable conductive material, or multilayers thereof.

The metal gate electrode layer 160 may be a multi-layer structure with various combinations of a diffusion barrier layer, work function layers with a selected work function to enhance the device performance (e.g., threshold voltage) for n-channel FETs in the NMOS region 50 and p-channel FETs in the PMOS region 60, a capping layer to prevent oxidation of work function layers, a glue layer to adhere work function layers to a next layer, and a metal fill layer to reduce the total resistance of gate stacks, and/or another suitable layer.

The metal gate electrode layer 160 may be formed by ALD, PVD, CVD, e-beam evaporation, or another suitable process. The metal gate electrode layer 160 may be formed separately for n-channel FETs and p-channel FETs, which may use different work function materials. In some embodiments, an n-channel FET in the NMOS region 50 and a p-channel FET in the PMOS region 60 may share a single continuous metal fill layer, such as tungsten (W), ruthenium (Ru), cobalt (Co), or another metal material with high conductivity.

A planarization process such as CMP may be performed on the semiconductor structure 100 to remove the materials of the high-k dielectric layers 158 and the metal gate electrode layer 160 formed above the upper surface of the interlayer dielectric layer 148, in accordance with some embodiments. After the planarization process, the upper surfaces of the metal gate electrode layer 160, the upper surface of the gate spacer layers 136 and the upper surface of the interlayer dielectric layer 148 are substantially coplanar, in accordance with some embodiments.

Portions of the interfacial layers 156, the high-k dielectric layers 158 and the metal gate electrode layers 160 at the NMOS region 50 combine to form first final gate stacks 154, in accordance with some embodiments. The first final gate stacks 154 may engage the channel region of the nanostructures 108, such that current can flow between the first source/drain features 144 during operation. Portions of the interfacial layers 156, the high-k dielectric layers 158 and the metal gate electrode layers 160 at the PMOS region 60 combine to form second final gate stacks 162, in accordance with some embodiments. The second final gate stacks 162 may engage the channel region of the second fin structure 118, such that current can flow between the second source/drain features 146 during operation.

In some embodiments, the final gate stacks 154 and 162 extend in Y direction. That is, the final gate stacks 154 and 162 have longitudinal axes parallel to Y direction, in accordance with some embodiments. The final gate stacks 154 and 162 are arranged in X direction. In some embodiments, because the upper surface of the second fin structure 118 is higher than the upper surface of the uppermost nanostructure 118B by a distance D1, the top of the interfacial layer 156 of the second final gate stack 162 is located at a higher level than the top of interfacial layer 156 of the first final gate stack 154.

The first final gate stacks 154 interposing the first source/drain features 144 combine with the first source/drain features 144 to form n-channel gate-all-around FETs 100A at the NMOS region 50, in accordance with some embodiments. The second final gate stacks 162 interposing the second source/drain features 146 combine with the second source/drain features 146 to form p-channel FinFETs 100B at the PMOS region 60, in accordance with some embodiments. In some embodiments, the n-channel gate-all-around FETs 100A and the p-channel FinFETs 100B share a common final gate stack 154/162.

It is understood that the semiconductor structure 100 may undergo further complementary metal-oxide semiconductor (CMOS) manufacturing processes to form a semiconductor device on the substrate 102, e.g., logic devices (e.g., CMOS devices), SRAM, etc. For example, various features, such as contact plugs, vias, interconnect metal layers, intermetal dielectric (IMD) layers, and/or passivation layers may be formed over the semiconductor substrate 100.

The embodiments of the present disclosure use the gate-all-around FETs 100A for n-channel devices and FinFETs 100B for p-channel devices, thereby improving the performance mismatch between n-channel devices and p-channel devices. Furthermore, because the embodiments of the present disclosure utilize the uppermost Si layer 108A and the uppermost SiGe layer 106A as a dummy layer and a polishing stop layer respectively for the planarization process (FIG. 2D), the uppermost nanostructure 108B may have a stable thickness, which may be substantially equal to the thicknesses of underlying nanostructures 108. As a result, the performance fluctuation of the n-channel gate-all round FETs 100A may be reduced, e.g., decreasing DIBL, decreasing channel resistance and/or increasing effective current.

In addition, according to some embodiments, because the planarization process stops at the polishing stop layer 106A, the second final gate stack 162 may engage a greater channel area and the second source/drain feature 146 may have a greater thickness, compared to a planarization process stopping at the top active layer 108B. As a result, the electrical performance of the p-channel FinFETs 100B may be enhanced, e.g., increasing current.

As described above, the aspect of the embodiments of the present disclosure is direct to a formation method and structures that provide hybrid structures including the n-channel gate-all-around FETs 100A and the p-channel FinFETs 100B formed over the same substrate 102, thereby enhancing the electrical performance of the devices. Furthermore, the method of the embodiments of the present disclosure utilizes the uppermost first semiconductor layer 106A as a polishing stop layer, which may allow the uppermost nanostructure 108B of the n-channel gate-all-around FET 100A having a stable thickness, thereby reducing the performance fluctuation of the n-channel gate-all-around FETs 100A. Furthermore, the polishing stop layer 106A is removed before the formation of the inner spacer layers 142, thereby preventing the damage to the first source/drain feature 144 during the channel releasing process. Furthermore, the embodiments provide a semiconductor structure including a p-channel FinFET 100B which includes a taller fin structure, higher gate dielectric layer, taller source/drain feature than those of the n-channel gate-all-around FET 100A, which may enhance the electrical performance of the p-channel FinFETs 100B.

Embodiments of a method for forming a semiconductor structure may be provided. The method may include forming a polishing stop layer and a dummy layer over a stack, forming a semiconductor layer through the dummy layer, the polishing stop layer and the stack, and planarizing the dummy layer and the semiconductor layer until the polishing stop layer is exposed. The method may also include patterning the stack into nanostructures. Therefore, the uppermost nanostructure may have a stable thickness, thereby reducing the performance fluctuation of the device.

In some embodiments, a method for forming a semiconductor structure is provided. The method includes forming a stack over a substrate. The stack includes alternating first semiconductor layers and second semiconductor layers. The method also includes forming a polishing stop layer over the stack and a dummy layer over the polishing stop layer, recessing the dummy layer, the polishing stop layer, and the stack to form a recess, forming a third semiconductor layer to fill the recess, and planarizing the dummy layer and the third semiconductor layer until the polishing stop layer is exposed. The method also includes patterning the polishing stop layer and the stack into a first fin structure and the third semiconductor layer into a second fin structure, removing the second semiconductor layers of the first fin structure to form nanostructures, and forming a gate stack across the first fin structure and the second fin structure.

In some embodiments, a method for forming a semiconductor structure is provided. The method structure includes forming a first fin structure and a second fin structure over a substrate. The first fin structure includes a first silicon germanium layer, a silicon layer and a second silicon germanium layer sequentially stacked. The method also includes forming an insulating material to surround the first fin structure and the second fin structure, removing the second silicon germanium layer of the first fin structure, thereby exposing an upper surface of the silicon layer of the first fin structure, and recessing the insulating material. The method also includes etching the first fin structure and the second fin structure to form a first source/drain recess and a second source/drain recess respectively, and forming a first source/drain feature from the first source/drain recess and a second source/drain feature from the second source/drain recess.

In some embodiments, a semiconductor structure is provided. The semiconductor structure includes a gate-all-around FET and a FinFET. The gate-all-around FET includes a plurality of nanostructures vertically stacked over a substrate, a first gate dielectric layer around the plurality of nanostructure, and a first gate electrode wrapping around the gate dielectric layer. The FinFET includes a fin structure adjacent to the plurality of nanostructures, a second gate dielectric layer along the fin structure, and a second gate electrode over the second gate dielectric layer. A top of the second interfacial layer is higher than a top of the first interfacial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming a stack over a substrate, the stack including alternating first semiconductor layers and second semiconductor layers;
   forming a polishing stop layer over the stack and a dummy layer over the polishing stop layer;
   recessing the dummy layer, the polishing stop layer, and the stack to form a recess;
   forming a third semiconductor layer to fill the recess;
   planarizing the dummy layer and the third semiconductor layer until the polishing stop layer is exposed;
   patterning the polishing stop layer and the stack into a first fin structure and the third semiconductor layer into a second fin structure;
   removing the first semiconductor layers of the first fin structure to form nanostructures; and
   forming a gate stack across the nanostructures and the second fin structure.

2. The method for forming the semiconductor structure as claimed in claim 1, wherein the polishing stop layer is made of silicon germanium, the dummy layer is made of silicon, and the third semiconductor layer is made of silicon.

3. The method for forming the semiconductor structure as claimed in claim 1, further comprising:
   forming an insulating material to surround the first fin structure and the second fin structure; and
   removing the polishing stop layer, thereby exposing one of the second semiconductor layers of the first fin structure.

4. The method for forming the semiconductor structure as claimed in claim 3, wherein the second fin structure is taller than the first fin structure after removing the polishing stop layer.

5. The method for forming the semiconductor structure as claimed in claim 3, further comprising:
recessing the insulating material after removing the polishing stop layer, thereby forming an isolation structure surrounding a lower portion of the first fin structure and a lower portion of the second fin structure.

6. The method for forming the semiconductor structure as claimed in claim 3, further comprising:
forming a dummy gate structure across the first fin structure and the second fin structure; and
forming a gate spacer layer along a sidewall of the dummy gate structure, wherein the gate spacer layer is in contact with an upper surface of the one of the second semiconductor layers of the first fin structure.

7. The method for forming the semiconductor structure as claimed in claim 1, wherein the recess has a bottom surface below a bottom surface of the stack.

8. The method for forming the semiconductor structure as claimed in claim 1, wherein the gate stack comprises a gate electrode layer continuously extending across the nanostructures and the second fin structure.

9. A method for forming the semiconductor structure, comprising:
forming a first fin structure and a second fin structure over a substrate, the first fin structure including a first silicon germanium layer, a silicon layer and a second silicon germanium layer sequentially stacked;
forming an insulating material to surround the first fin structure and the second fin structure;
removing the second silicon germanium layer of the first fin structure, thereby exposing an upper surface of the silicon layer of the first fin structure;
recessing the insulating material;
etching the first fin structure and the second fin structure to form a first source/drain recess and a second source/drain recess respectively; and
forming a first source/drain feature from the first source/drain recess and a second source/drain feature from the second source/drain recess, wherein an upper surface of the first source/drain feature is located below an upper surface of the second source/drain feature.

10. The method for forming the semiconductor structure as claimed in claim 9, wherein the upper surface of the silicon layer of the first fin structure is located below an upper surface of the second fin structure after removing the second silicon germanium layer of the first fin structure.

11. The method for forming the semiconductor structure as claimed in claim 9, further comprising:
forming a dummy gate structure across the first fin structure and the second fin structure; and
forming a gate spacer layer along a sidewall of the dummy gate structure, wherein the gate spacer layer is in contact with the upper surface of the silicon layer of the first fin structure.

12. The method for forming the semiconductor structure as claimed in claim 9, wherein the second silicon germanium layer of the first fin structure is removed using an ammonia hydroxide-hydrogen peroxide-water mixture (APM), ammonium hydroxide ($NH_4OH$), tetramethylammonium hydroxide (TMAH), ethylenediamine pyrocatechol (EDP), and/or potassium hydroxide (KOH) solutions.

13. The method for forming the semiconductor structure as claimed in claim 9, wherein the first source/drain feature is doped with an n-type dopant and the second source/drain feature is doped with a p-type dopant.

14. The method for forming the semiconductor structure as claimed in claim 9, further comprising, before forming the first source/drain feature and the second source/drain feature:
recessing the first silicon germanium layer to form a notch; and
forming an inner spacer layer in the notch.

15. The method for forming the semiconductor structure as claimed in claim 9, wherein forming the first fin structure and the second fin structure comprises:
forming a stack over the substrate, the stack including the first silicon germanium layer, the silicon layer, the second silicon germanium layer and a second silicon layer sequentially stacked;
etching the stack to form a recess;
growing a third silicon layer from the recess;
planarizing the stack and the third silicon layer to remove the second silicon layer of the stack; and
etching the stack and the third silicon layer to from the first fin structure and the second fin structure respectively.

16. The method for forming the semiconductor structure as claimed in claim 9, wherein the second fin structure includes an upper fin element made of silicon, an upper surface of the upper fin element is higher than an upper surface of the silicon layer, and a bottom surface of the upper fin element is lower than a bottom surface of the first silicon germanium layer.

17. A method for forming the semiconductor structure, comprising:
forming a stack in which a first semiconductor layer, a second semiconductor layer, a third semiconductor layer and a fourth semiconductor layer sequentially stacking over a substrate;
forming a fifth semiconductor layer adjacent to the stack, wherein the fifth semiconductor layer is in direct contact with sidewalls of the first semiconductor layer, the second semiconductor layer, the third semiconductor layer and the fourth semiconductor layer of the stack;
removing the fourth semiconductor layer of the stack and a portion of the fifth semiconductor layer;
etching the stack and the fifth semiconductor layer to form a first fin structure and a second fin structure, respectively;
removing the third semiconductor layer of the first fin structure to expose the second semiconductor layer of the first fin structure; and
forming a dummy gate dielectric layer over the first fin structure and the second fin structure; and
forming a dummy gate electrode layer over the dummy gate dielectric layer.

18. The method for forming the semiconductor structure as claimed in claim 17, further comprising:
forming a patterned mask layer over the stack and the fifth semiconductor layer before etching the stack and the fifth semiconductor layer to form the first fin structure and the second fin structure, respectively;
forming an insulating material to surround the first fin structure and the second fin structure;
removing the patterned mask layer; and
recessing the insulating material to expose sidewalls of the first fin structure and sidewalls of the second fin structure after removing the third semiconductor layer of the first fin structure.

19. The method for forming the semiconductor structure as claimed in claim 17, wherein the dummy gate dielectric layer includes a first portion directly over an upper surface of the first fin structure and a second portion directly over the second fin structure, and the first portion of the dummy gate dielectric layer is lower than the second portion of the dummy gate dielectric layer.

20. The method for forming the semiconductor structure as claimed in claim 17, further comprising:
    etching the stack to form a recess extending into the substrate, wherein the fifth semiconductor layer is formed in the recess.

* * * * *